US006713394B2

(12) United States Patent
Nagahara et al.

(10) Patent No.: US 6,713,394 B2
(45) Date of Patent: *Mar. 30, 2004

(54) PROCESS FOR PLANARIZATION OF INTEGRATED CIRCUIT STRUCTURE WHICH INHIBITS CRACKING OF LOW DIELECTRIC CONSTANT DIELECTRIC MATERIAL ADJACENT UNDERLYING RAISED STRUCTURES

(75) Inventors: Ronald J. Nagahara, San Jose, CA (US); Jayanthi Pallinti, Santa Clara, CA (US); Dawn Michelle Lee, Lake Oswego, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/253,158

(22) Filed: Sep. 24, 2002

(65) Prior Publication Data

US 2003/0017704 A1 Jan. 23, 2003

Related U.S. Application Data

(63) Continuation of application No. 09/661,465, filed on Sep. 13, 2000, now Pat. No. 6,489,242.

(51) Int. Cl.$^7$ ............................................. H01L 21/302
(52) U.S. Cl. ....................... 438/692; 438/691; 438/693; 438/697
(58) Field of Search ................................. 438/690, 691, 438/692, 693, 624, 626, 697

(56) References Cited

U.S. PATENT DOCUMENTS 3,012,861 A 12/1961 Ling .......................... 23/223.5

(List continued on next page.)

FOREIGN PATENT DOCUMENTS

EP          0 706 216 A2    4/1996    ......... H01L/23/532

(List continued on next page.)

OTHER PUBLICATIONS

Dobson, C.D., et al., "Advanced SiO$_2$ Planarization Using Silane and H$_2$O$_2$", *Semiconductor International*, Dec. 1994, pp. 85–88.

(List continued on next page.)

*Primary Examiner*—Lan Vinh
(74) *Attorney, Agent, or Firm*—John P. Taylor

(57) ABSTRACT

A planarization process for an integrated circuit structure which inhibits or prevents cracking of low k dielectric material which comprises one of one or more layers of dielectric material formed over raised portions of the underlying integrated circuit structure. Prior to the planarization step, a removable mask is formed over such one or more dielectric layers formed over raised portions of the integrated circuit structure. Openings are formed in the mask to expose a portion of the upper surface of the one or more dielectric layers in the region over at least some of these raised portions of the integrated circuit structure. Exposed portions of the underlying one or more dielectric layers are then etched through such openings in the mask to reduce the overall amount of the one or more dielectric layers overlying such raised portions of the integrated circuit structure. The mask is then removed and the structure is subject to a chemical mechanical polishing step to planarize the upper surface of the structure. The prior removal of a portion of the overall volume of the one or more dielectric layers in the region overlying the raised portions of the integrated circuit structure before the planarization step results in a shortening of the CMP process which, in turn, results in a shortening of the time during which the structure is subject to the mechanical stresses of the CMP process. This inhibits or eliminates cracking of the low k dielectric layer adjacent the region of the low k dielectric layer over raised portions of the underlying integrated circuit structure.

17 Claims, 5 Drawing Sheets

U.S. PATENT DOCUMENTS

| | | | |
|---|---|---|---|
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,816,900 A | 10/1998 | Nagahara et al. | 451/285 |
| 5,835,226 A | 11/1998 | Berman et al. | 356/382 |
| 5,858,879 A | 1/1999 | Chao et al. | 438/725 |
| 5,863,825 A | 1/1999 | Pasch et al. | 438/401 |
| 5,864,172 A | 1/1999 | Kapoor et al. | 257/634 |
| 5,865,666 A | 2/1999 | Nagahara | 451/10 |
| 5,868,608 A | 2/1999 | Allman et al. | 451/72 |
| 5,874,367 A | 2/1999 | Dobson | 438/787 |
| 5,874,745 A | 2/1999 | Kuo | 257/59 |
| 5,877,032 A * | 3/1999 | Guinn et al. | 438/9 |
| 5,882,251 A | 3/1999 | Berman et al. | 451/527 |
| 5,882,489 A | 3/1999 | Bersin et al. | 204/192.35 |
| 5,888,120 A | 3/1999 | Doran | 451/41 |
| 5,893,756 A | 4/1999 | Berman et al. | 438/692 |
| 5,904,154 A | 5/1999 | Chien et al. | 134/1.2 |
| 5,915,203 A | 6/1999 | Sengupta et al. | 438/669 |
| 5,930,655 A | 7/1999 | Cooney, III et al. | 438/474 |
| 5,931,719 A | 8/1999 | Nagahara et al. | 451/41 |
| 5,939,763 A | 8/1999 | Hao et al. | 257/411 |
| 5,941,761 A | 8/1999 | Nagahara et al. | 451/56 |
| 5,944,585 A | 8/1999 | Nagahara et al. | 451/56 |
| 5,957,757 A | 9/1999 | Berman | 451/56 |
| 5,961,375 A | 10/1999 | Nagahara et al. | 451/41 |
| 5,985,679 A | 11/1999 | Berman | 438/7 |
| 5,989,998 A | 11/1999 | Sugahara et al. | |
| 5,990,010 A | 11/1999 | Berman | 438/691 |
| 5,990,558 A * | 11/1999 | Tran | 257/759 |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,145 A * | 3/2000 | Suzuki et al. | 438/622 |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,054,379 A | 4/2000 | Yau | |
| 6,063,702 A * | 5/2000 | Chung | 438/624 |
| 6,066,266 A | 5/2000 | Osugi et al. | 216/85 |
| 6,066,574 A | 5/2000 | You et al. | 438/781 |
| 6,069,085 A | 5/2000 | Berman | 438/697 |
| 6,071,818 A | 6/2000 | Chisholm et al. | 438/692 |
| 6,074,288 A | 6/2000 | Nagahara et al. | 451/384 |
| 6,074,517 A | 6/2000 | Taravade | 156/345 |
| 6,077,783 A | 6/2000 | Allman et al. | 438/691 |
| 6,080,670 A | 6/2000 | Miller et al. | 438/691 |
| 6,114,186 A * | 9/2000 | Jeng et al. | 438/623 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,215,087 B1 | 4/2001 | Akahori et al. | |
| 6,232,658 B1 | 5/2001 | Catabay et al. | 257/701 |
| 6,489,242 B1 * | 12/2002 | Nagahara et al. | 438/691 |

FOREIGN PATENT DOCUMENTS

| | | | |
|---|---|---|---|
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO99/41423 | 8/1999 | |

OTHER PUBLICATIONS

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Koda, Seiichiro, et al., "A Study of Inhibition Effects for Silane Combustion by Additive Gases", *Combustion and Flame*, vol. 73, No. 2, Aug., 1988, pp. 187–194.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

\* cited by examiner

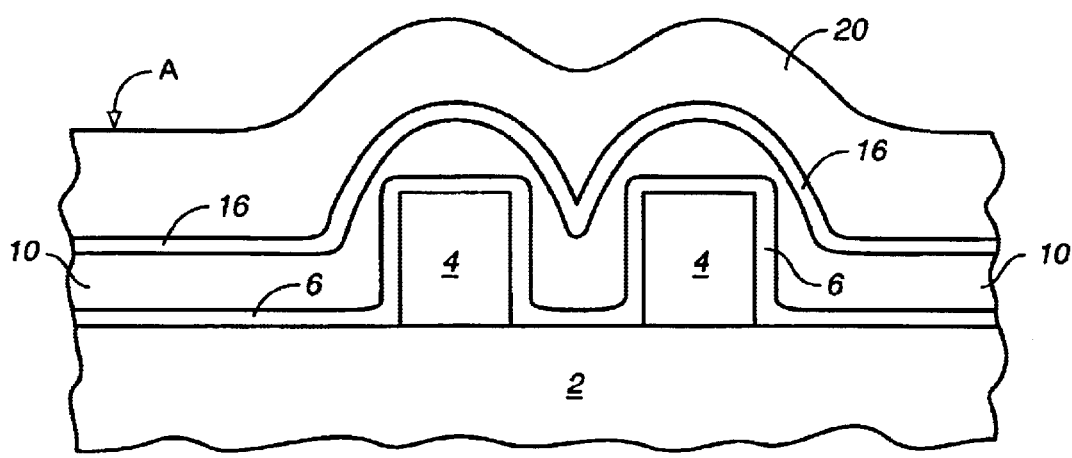
FIG._1 (PRIOR ART)
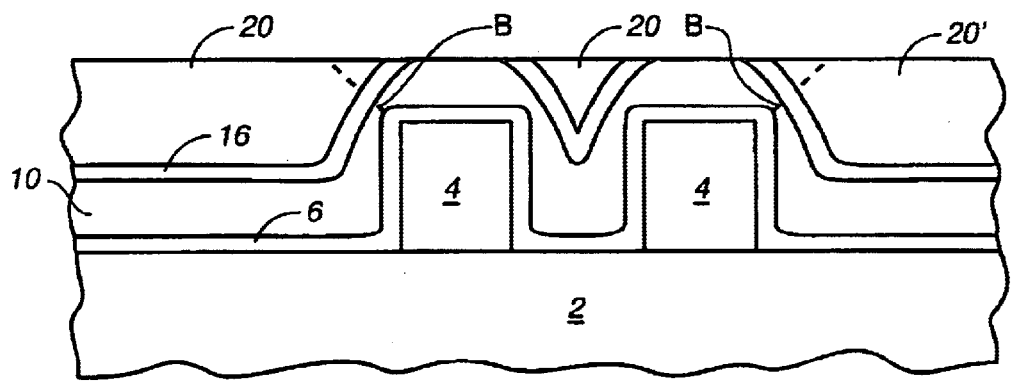
FIG._2 (PRIOR ART)
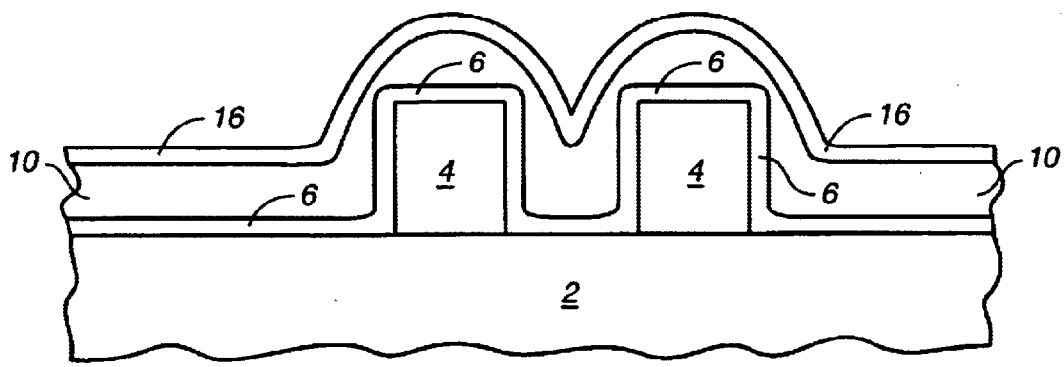
FIG._3

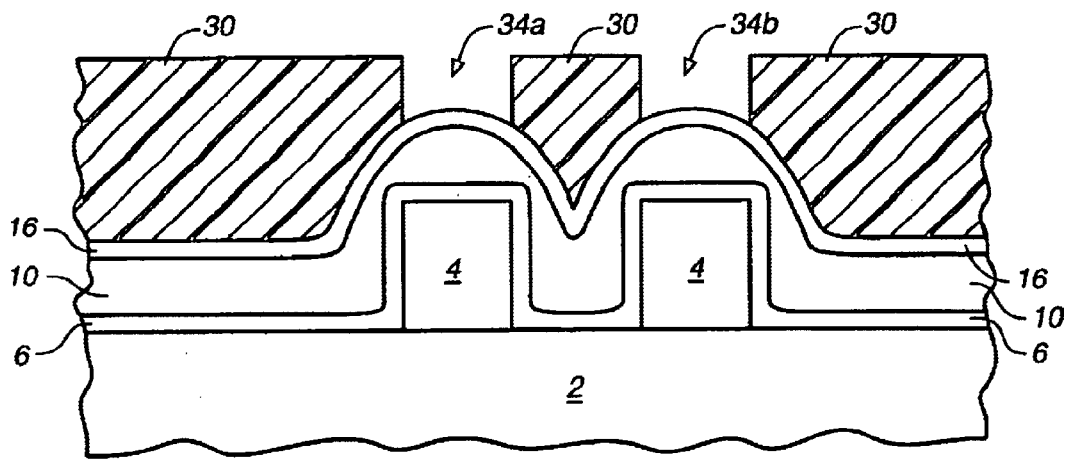
FIG._4
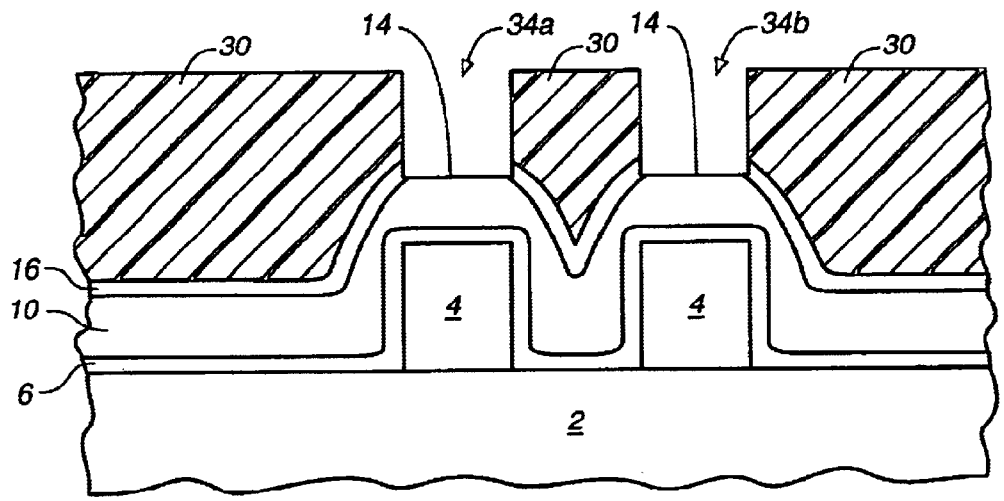
FIG._5
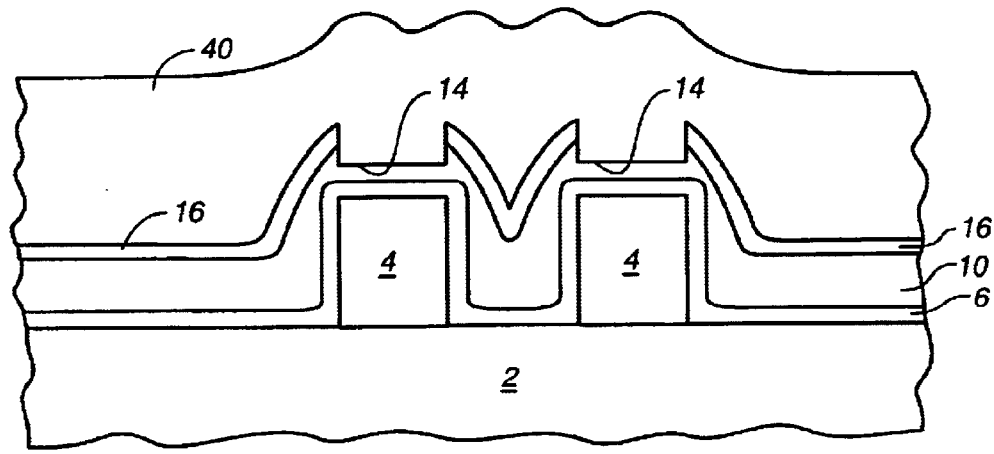
FIG._6

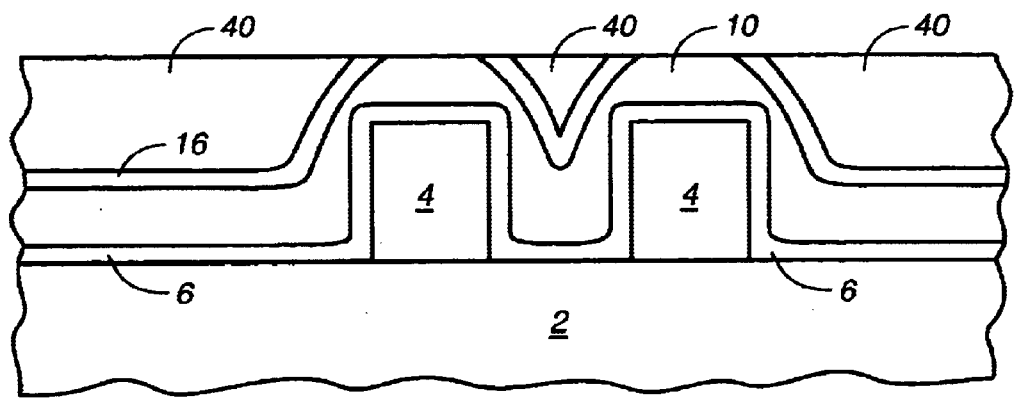
FIG._7
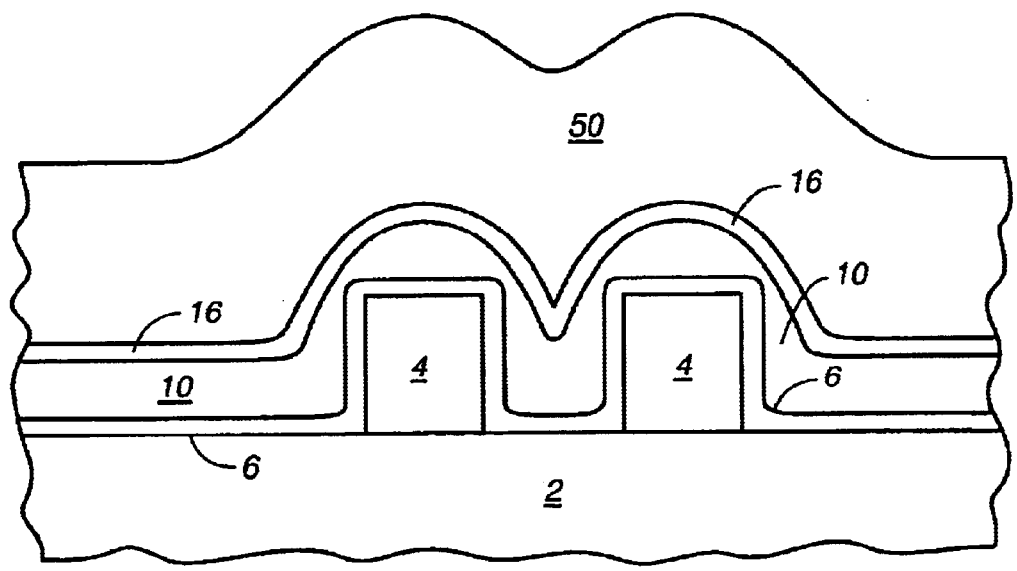
FIG._8

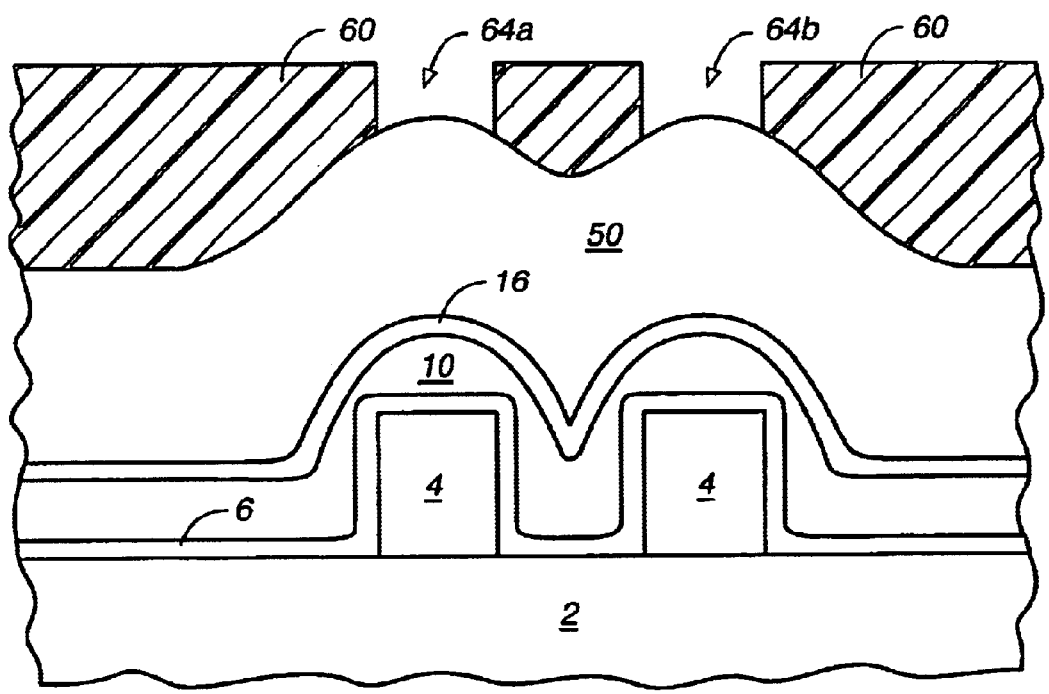
FIG._9
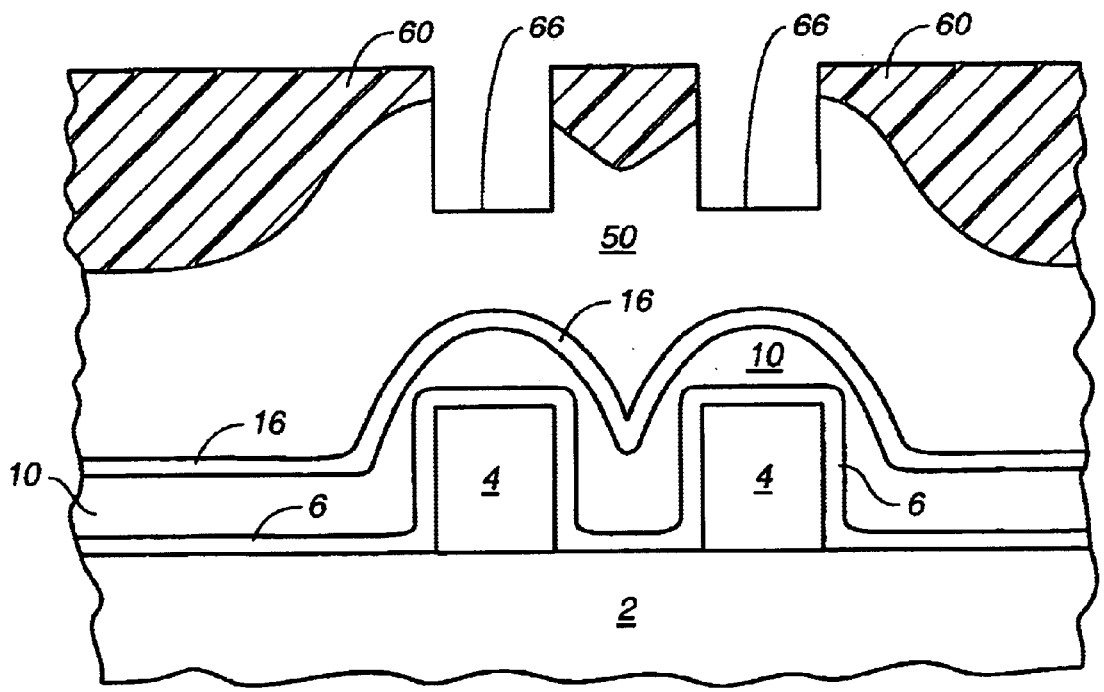
FIG._10

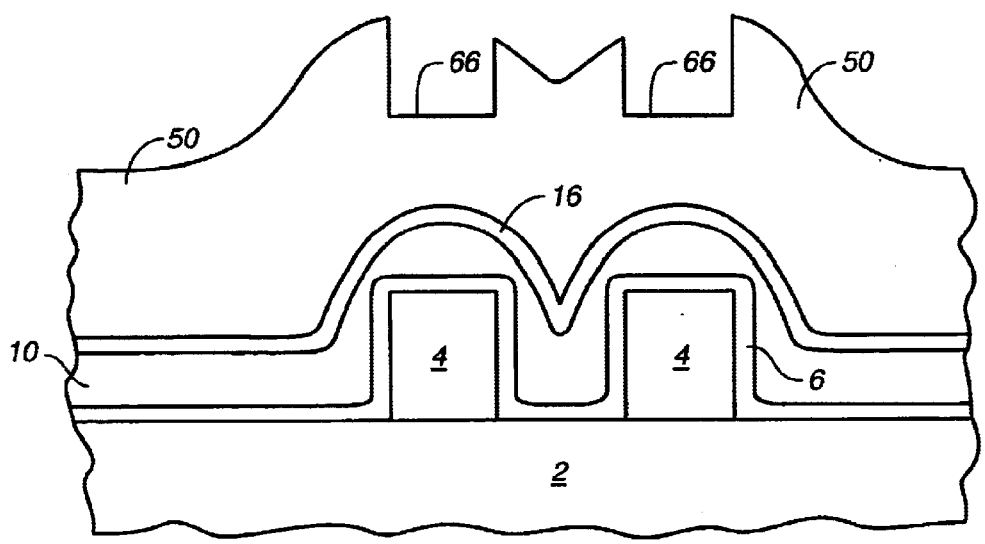
FIG._11
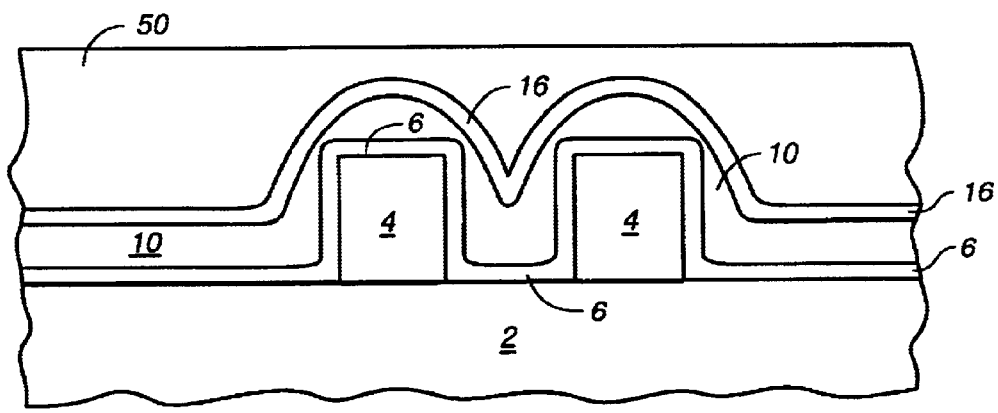
FIG._12
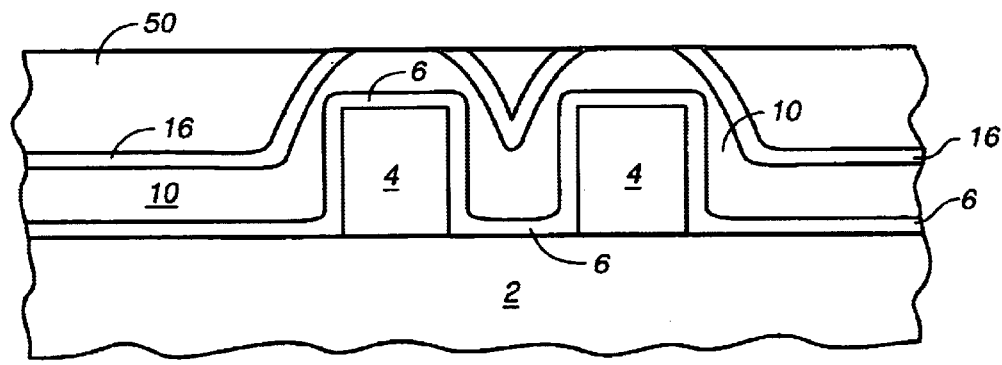
FIG._12A

PROCESS FOR PLANARIZATION OF INTEGRATED CIRCUIT STRUCTURE WHICH INHIBITS CRACKING OF LOW DIELECTRIC CONSTANT DIELECTRIC MATERIAL ADJACENT UNDERLYING RAISED STRUCTURES

CROSS-REFERENCE TO RELATED APPLICATION

This application is a continuation of U.S. patent application Ser. No. 09/661,465 filed Sep. 13, 2000, and now issued as U.S. Pat. No. 6,489,242, on Dec. 3, 2002.

BACKGROUND OF THE INVENTION

1. Field of the Invention

This invention relates to planarization of dielectric material on an integrated circuit structure. More particularly this invention relates to an improved process for planarizing dielectric material which includes low k dielectric material which inhibits cracking of the low k dielectric material adjacent raised portions of the underlying integrated circuit structure.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about developed by Trikon Technologies of Newport, Gwent, U.K. The process is said to react methyl silane ($CH_3$—$SiH_3$) with hydrogen peroxide ($H_2O_2$) to form monosilicic acid which is annealed at 400° C. to remove moisture.

The incorporation of such carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

While such carbon-doped silicon oxide dielectric materials do exhibit the desired low k (i.e., dielectric constants below about 3.0) resulting in reduced capacitance of the dielectric material, it has been noted that cracking of the low k dielectric material sometimes occurs adjacent the regions of the layer of low k dielectric material formed over raised portions of the underlying integrated circuit structure. This cracking is particularly noted during or after planarization of the resulting structure using chemical mechanical polishing (CMP) processing.

One of the reasons for this cracking of the low k dielectric material during or after CMP planarization appears to be related to the tendency of the low k dielectric material to accumulate or "pile-up" over the raised underlying portions of the integrated circuit structure (such as a grouping of metal pads, or even more severely over wide lines) resulting in the need to remove an excessive amount of such low k dielectric material during the CMP planarization step, which, in turn, is believed to cause stresses in the low k dielectric layer being polished due to the nature of the CMP process.

Prior art FIGS. 1 and 2 illustrate the problem. FIG. 1 shows a typical integrated circuit structure at 2 having raised wide portions 4 such as metal pads or other wide structure formed thereon. Formed over raised portions 4 and underlying structure 2 is a composite layer of dielectric material comprising a thin base layer 6 of dielectric material, a low k carbon-doped silicon oxide dielectric layer 10, and a thin capping layer 16 of dielectric material. Base layer 6 and capping layer 16, which may comprise conventional silicon oxide, serve to protect the surfaces of low k dielectric layer 10, as well as to facilitate adherence of the layer of low k material to other layers of the integrated circuit structure. A planarization layer 20 comprising, for example, any conventionally formed silicon oxide, is deposited over capping layer 16 and the structure is then planarized by subjecting it to a CMP process.

In order to planarize the structure down to the level of planarization layer 20 shown at arrow A (where there are no raised features in the underlying integrated circuit structure), it is necessary to remove a considerable amount of the portion of planarization layer 20 lying over raised portions 4. In fact, as shown in FIG. 2, it is even necessary to removed some of underlying capping layer 16 and low k layer 10 to complete the planarization. The planarization process thus must be carried on for an extended period of time, which, in turn, results in an extended period of time during which the structure is under mechanical stress in order to remove the excessive amount of dielectric material over raised portions 4. This, it is believed, results in the formation of cracks in the low k dielectric material which appear most often adjacent extending from the edges of the raised portions, as shown by the dotted lines labelled B in FIG. 2. It would, therefore, be desirable to provide a planarization process wherein the upper surface of one or more dielectric layers formed over an integrated circuit structure having raised portions would be planarized, for example, to facilitate further photolithography, without however resulting in such undesirable cracking of the dielectric materials such as low k dielectric layer 10.

SUMMARY OF THE INVENTION

In accordance with the invention, a planarization process is provided for an integrated circuit structure which inhibits or prevents cracking of low k dielectric material which comprises one of one or more layers of dielectric material formed over raised portions of the underlying integrated circuit structure. Prior to the planarization step, a removable mask is formed over one or more of the dielectric layers formed over raised portions of the integrated circuit structure. Openings are formed in the mask to expose the upper surface of the one or more dielectric layers in the region over at least some of these raised portions of the integrated circuit structure. Exposed portions of the underlying one or more dielectric layers are then etched through such openings in the mask to reduce the overall amount or volume of the one or more dielectric layers overlying such raised portions of the integrated circuit structure. The mask is then removed and the structure is subject to a chemical mechanical polishing step to planarize the upper surface of the structure. The prior removal, before the planarization step, of a portion of the overall amount or volume of the one or more dielectric layers in the region overlying the raised portions of the integrated circuit structure results in a shortening of the CMP process which, in turn, results in a shortening of the time during which the structure is subject to the mechanical stresses of the CMP process. This inhibits or eliminates cracking of the low k dielectric layer adjacent the region of the low k dielectric layer over raised portions of the underlying integrated circuit structure.

BRIEF DESCRIPTION OF THE DRAWINGS

FIG. 1 is a fragmentary vertical cross-sectional view of a prior art integrated circuit structure showing layers of dielectric material, including a layer of low k dielectric material, formed over raised portions of the integrated circuit structure prior to a planarizing step.

FIG. 2 is a fragmentary vertical cross-sectional view of the prior art integrated circuit structure of FIG. 1 after a planarizing step, showing cracks formed in the dielectric materials by the planarization process.

FIG. 3 is a fragmentary vertical cross-sectional view of an integrated circuit structure showing a base layer of dielectric material, a layer of low k dielectric material, and a capping layer of dielectric material all formed over raised portions of the integrated circuit structure.

FIG. 4 is a fragmentary vertical cross-sectional view of the structure of FIG. 3 after formation of a removable mask layer over the structure, with openings in the mask over raised portions of the structure beneath the dielectric layers.

FIG. 5 is a fragmentary vertical cross-sectional view of the structure of FIG. 4 after etching of the raised capping layer and low k layer of dielectric material exposed through the openings in the mask to thereby remove some of the capping layer and low k layer of dielectric material prior to the planarization step.

FIG. 6 is a fragmentary vertical cross-sectional view of the structure of FIG. 5 after removal of the etch mask and deposition of a planarizable layer of dielectric material over the etched structure.

FIG. 7 is a fragmentary vertical cross-sectional view of the structure of FIG. 6 after chemical mechanical polishing (CMP) planarization of the structure.

FIG. 8 is a fragmentary vertical cross-sectional view of another embodiment of the process of the invention showing the deposition of a planarization layer of dielectric material over the structure of FIG. 3 prior to the etching step of the invention.

FIG. 9 is a fragmentary vertical cross-sectional view of the structure of FIG. 8 after formation of a removable mask layer over the structure, with openings in the mask over raised portions of the structure beneath the dielectric layers.

FIG. 10 is a fragmentary vertical cross-sectional view of the structure of FIG. 9 after etching of the planarization layer exposed through the openings in the mask to thereby remove some of the planarization layer prior to the planarization step.

FIG. 11 is a fragmentary vertical cross-sectional view of the structure of FIG. 10 after removal of the etch mask, and showing the planarizable layer of dielectric material partially etched away prior to the planarization step.

FIG. 12 is a fragmentary vertical cross-sectional view of the structure of FIG. 11 after chemical mechanical polishing (CMP) planarization of the structure without removal of any of the capping layer or low k layer of dielectric material.

FIG. 12A is a fragmentary vertical cross-sectional view of a modification of FIG. 12 wherein some of the capping layer and some of the low k layer of dielectric material may also be removed by the chemical mechanical polishing (CMP) planarization of the structure even in this embodiment if the final thickness specification require it.

DETAILED DESCRIPTION OF THE INVENTION

The invention comprises an improved planarization process for an integrated circuit structure which inhibits or prevents cracking of low k dielectric material which comprises one of one or more layers of dielectric material formed over raised portions of the underlying integrated circuit structure. Prior to the planarization step, a removable mask is formed over such one or more dielectric layers formed over raised portions of the integrated circuit structure. Openings are formed in the mask to expose the upper surface of the one or more dielectric layers in the region over at least some of these raised portions of the integrated circuit structure. Exposed portions of the underlying one or more dielectric layers are then etched through such openings in the mask to reduce the overall volume of the one or more dielectric layers overlying such raised portions of the integrated circuit structure. The mask is then removed and the structure is subject to a chemical mechanical polishing step to planarize the upper surface of the structure. The prior removal, before the planarization step, of some of the overall amount or volume of the one or more dielectric layers in the region overlying the raised portions of the integrated circuit structure results in a shortening of the CMP process which, in turn, results in a shortening of the time during which the structure is subject to the mechanical stresses of the CMP process. This inhibits or eliminates cracking of the low k dielectric layer adjacent the region of the low k dielectric layer over raised portions of the underlying integrated circuit structure.

Turning now to the drawings, FIG. 3 shows a typical structure generally similar to that previously described with respect to FIG. 1, except for the absence of planarization dielectric layer 20. An integrated circuit structure formed in a semiconductor substrate is generally shown at 2 having raised wide portions 4 such as metal pads or other wide structure formed thereon. Formed over raised portions 4 and underlying structure 2 is a composite layer of dielectric material comprising a thin base layer 6 of dielectric material, a low k carbon-doped silicon oxide dielectric layer 10, and a thin capping layer 16 of dielectric material. The term "low k", as used herein, is intended to define a dielectric material having a dielectric constant of 3.5 or less. Preferably, the dielectric constant of "low k" dielectric material 10 will be 3.0 or less.

Low k dielectric layer 10 may comprise the reaction product of methyl silane ($CH_3SiH_3$) and hydrogen peroxide ($H_2O_2$), as described in the previously cited Peters article, or it may comprise the reaction product of a mild oxidant such as hydrogen peroxide with the carbon-substituted silane materials disclosed in Aronowitz et al. U.S. Pat. No. 6,303,047, issued Oct. 16, 2001, and assigned to the assignee of this application, the subject matter of which is hereby incorporated by reference.

The thickness of low k dielectric layer 10 will depend upon the height of the raised conductive members since it is particularly desirable that as much as possible of the lateral space between horizontally adjacent conductive members be filled with low k dielectric material to reduce the horizontal capacitance between adjacent conductors.

Base layer 6 and capping layer 16 each serve as barrier layers to protect the surfaces of low k dielectric layer 10, as well as to facilitate adherence of the layer of low k material to other layers of the integrated circuit structure. Base layer 6 and capping layer 16 may each comprise conventional silicon oxide, or either or both layers could comprise low k dielectric material, such as described and claimed in Wilbur G. Catabay, Wei-Jen Hsia, and Kai Zhang U.S. Pat. No. 6,492,731 B1, issued Dec. 10, 2002, entitled "COMPOSITE LOW DIELECTRIC CONSTANT FILM FOR INTEGRATED CIRCUIT STRUCTURE", and assigned to the assignee of this invention, the subject matter of which is hereby incorporated by reference.

Base layer 6 and capping layer 16 may each range in thickness from a minimum thickness of about 50 nanometers (nm), which is sufficient to provide the desired minimum barrier, up to a maximum thickness of about 500 nm. While base layer 6 and capping layer 16 may each exceed the maximum thickness of about 500 nm, this will not be desirable since this defeats the reasons for providing low k dielectric layer 10 between base layer 6 and capping layer 16 when the dielectric material comprising layers 6 and 16 is not low k dielectric material.

After forming the composite dielectric layer comprising base layer 6, low k dielectric layer 10, and capping layer 16, a removable mask layer 30 is formed over the structure, as shown in FIG. 4. Mask layer 30 may comprise a photoresist mask having mask openings 34a and 34b formed therein by photolithography. Mask openings 34a and 34b represent a plurality of openings generally formed in mask layer 30 over raised portions of the underling composite dielectric layer, and preferably such openings 34a and 34b are aligned, i.e., formed in registry, with the peaks (highest parts) of the underlying raised portions of the integrated circuit structure.

Such raised portions, and especially the peaks of such raised portions, represent regions where the most dielectric material will have to be removed in a subsequent planarization process such as a chemical mechanical polishing (CMP) process. It should be noted, in this regard, that it is not necessary that each such peak of the underlying structure have a corresponding opening formed in the mask in registry with such peak, since the purpose of the openings is to remove some, but not all, of the dielectric material over such peaks. Generally, however, the diameter of the mask openings (34a and 34b) will equal or exceed the line width of the underlying metal stack.

The diameter of each of the mask openings, and the density of the mask openings (number of openings per unit area) will depend on the total area of the raised portions of the underling integrated circuit structure and the overall height of the raised portions of the underlying structure relative to the height of other portions of the underlying structure. Generally the spacing (density) of the mask openings and the size (area) of each mask opening needed to inhibit or eliminate the occurrence of cracking of the low k dielectric layer adjacent the edges of raised portions of the underlying structure will be determined empirically for each structure.

After deposition of mask layer 30 and definition of mask openings 34a and 34b therein, the exposed portions of underlying capping layer 16, and, in most cases, underlying low k layer 10 as well, are etched through mask openings 34a and 34b to remove a portion of these dielectric layers, leaving openings 14 in dielectric layers 10 and 16, as shown in FIG. 5. The depth of the etch, like the previously discussed diameter and density of the mask openings, may be determined empirically as defining the minimum amount of dielectric material needed to be removed prior to a CMP planarization step to eliminate substantially all cracking of the low k dielectric layer adjacent raised portions of the underlying integrated circuit structure. By use of the term "substantially all", with respect to the amount of cracking of the low k material, is meant at least about 95% of the cracking and preferably at least about 99%.

Generally, the maximum depth of openings 14 etched in dielectric layers 10 and 16 through mask openings 34a and 34b is less than that depth which will penetrate underlying base layer 6 (since base layer 6 is very thin and penetration of base layer 6 could inadvertently result in penetration to conductive portions of underlying raised portions 4 of integrated circuit structure 2. Furthermore, the maximum depth of openings 14 should not downwardly extend through a plane defined by the upper surface of capping layer 16 over non-raised portions of the underlying integrated circuit structure.

The minimum depth of openings 14 etched into dielectric layers 16 and 10, taking into account the diameter, of each opening 14 and the number of such openings 14 etched into dielectric layers 10 and 16 in each region comprising raised portions of the underlying integrated circuit structure, will comprise that depth which will remove an amount of dielectric material over the raised portions of the integrated circuit structure of at least about 20% of the total amount of dielectric material which would have been removed by the CMP planarization process without such a prior etching step. Generally, the overall amount of dielectric material removed by the etching step will range from about 20% to about 50% of the total amount which would have been removed by the CMP planarization process without such a prior etching step.

After etching of openings 14 in dielectric layers 10 and 16, mask 30 is removed and a planarizing layer 40 of any conventional silicon oxide is formed over capping layer 16 and the openings 14 in layers 16 and 10. Since the peaks of underlying layers 16 and 10 have been removed by the etching step to form openings 14, the height of the peaks of planarizing layer 20 over layers 16 and 10 is reduced, resulting in less dielectric material needing to be removed in the subsequent planarization step.

A CMP planarization is then performed resulting in the planarized structure shown in FIG. 7 which will be found to have little if any cracking of the low k dielectric layer due to the reduction in time of the CMP planarizing step due to the reduction in the total amount of dielectric material to be polished away.

While the foregoing process results in inhibiting or eliminating the incidence of cracking of the low k dielectric material, it still shares another problem of the prior art. This problem is the exposure and etching of the upper surface of low k dielectric layer 10 during the planarization step due to the etching away of a portion of the protective capping layer 16 during the planarization process. This can be seen in prior art FIG. 2, as well as in FIG. 7, which represents the final structure formed after completion of the process of the invention.

FIGS. 8–12 illustrate another embodiment of the invention wherein the desired goal of eliminating cracking of the low k dielectric layer during planarization may be accomplished while maintaining the option of avoiding etching either capping layer 16 or low k layer 10 during the planarization step.

In FIG. 8, as in the previous embodiment, a typical integrated circuit structure is shown at 2 having raised wide portions 4 such as metal pads or other wide structure formed thereon. Formed over raised portions 4 and underlying structure 2 is a composite layer of dielectric material comprising a thin base layer 6 of dielectric material, a low k carbon-doped silicon oxide dielectric layer 10, and a thin capping layer 16 of dielectric material. However, unlike the prior embodiment, a planarization layer 50 comprising, for example, any conventionally formed silicon oxide, is now deposited over capping layer 16 prior to the previously described masking and etching steps.

Mask layer 60 having mask openings 64a and 64b is then formed over planarizing dielectric layer 50, as shown in FIG. 9. Dielectric layer 50 is then selectively etched through mask openings 64a and 64b to form openings 66 in dielectric layer 50, as shown in FIG. 10. As in the previous embodiment, mask openings 64a and 64b are preferably formed in mask 60 in registry with the peaks of the raised portions of the underlying integrated circuit structure to thereby maximize the amount of dielectric layer 50 which will be removed when openings 66 are formed down to a particular depth relative to the plane of the upper surface of capping layer 16. Mask 60 is then removed, as shown in FIG. 11, leaving a structure having reduced peaks of dielectric layer 50 which must be removed during the subsequent CMP planarization step to form the planarized structure shown in FIG. 12. It will be noted that the planarization step, in this embodiment, as shown in the planarized structure of FIG. 12, may be carried out completely on the upper layer 50 of dielectric material, and therefore no low k dielectric material is exposed. Alternatively, however, as shown in FIG. 12A, if the thickness specification require it, the option remains open to planarize the structure further, even though this results in exposure of either the capping layer 16 alone or both capping layer 16 and low k layer 10 as well.

As in the process of the prior embodiment, the CMP planarization process subsequently carried out will be found to result in little if any cracking of the low k dielectric layer due to the reduction in time of the CMP planarizing step due to the reduction in the total amount of dielectric material to be polished away. However, unlike the prior embodiment, such removal of planarized material prior to the CMP planarization step does not necessarily result in subsequent exposure of the low k dielectric material, during the CMP planarizing step, to the etchant materials used in the CMP planarization step.

Thus, the invention results in a planarized integrated circuit structure wherein cracks in the low k dielectric material adjacent raised portions of the underlying integrated circuit structure are inhibited or eliminated. The addition of masking and etching steps, carried out prior to the CMP planarization step to selectively etch away some of the exposed dielectric layer or layers beneath mask openings formed in registry with raised portions of the underlying integrated circuit structure, results in a reduction of the step height and resultant reduction in the planarization time, thus shortening the exposure time of the low k dielectric layer to the CMP planarization process resulting in inhibition or elimination of cracking of the low k dielectric layer adjacent raised portions of the underlying integrated circuit structure.

Having thus described the invention what is claimed is:

1. A planarization process for an integrated circuit structure which inhibits or prevents cracking of low k dielectric material which comprises:
   a) forming one of one or more layers of dielectric material, including a layer of low k dielectric material, over raised portions of the underlying integrated circuit structure;
   b) forming a layer of planarizable dielectric material over said one or more layers of dielectric material;
   c) forming a removable mask over said layer of planarizable dielectric material, said mask having openings formed therein in registry with peaks of at least some of said raised portions of said underlying integrated circuit structure to expose a portion of the upper surface of said one or more dielectric layers over at least some of said raised portions of said integrated circuit structure;
   d) etching exposed portions of said layer of planarizable dielectric material through such openings in the mask to remove at least some of said layer of planarizable dielectric material formed over said raised portions of said underlying integrated circuit structure and a portion, but not all, of said one or more dielectric layers formed over said raised portions of said underlying integrated circuit structure, to reduce the overall volume of said one or more dielectric layers overlying said raised portions of said underlying integrated circuit structure;
   e) removing said mask; and
   f) planarizing said planarizable layer of dielectric layer; whereby removal, before a planarization step, of at least some of said layer of planarizable dielectric material formed over said raised portions of said underlying integrated circuit structure and a portion of the overall volume of said one or more dielectric layers over said raised portions of said integrated circuit structure inhibits cracking of said layer of low k dielectric material.

2. The process of claim 1 which further includes a planarizing step which comprises planarizing by a chemical mechanical polishing step.

3. A planarization process for an integrated circuit structure which inhibits or prevents cracking of low k dielectric material which comprises:
   a) forming one of one or more layers of dielectric material, including a layer of low k dielectric material, over at least raised portions of the underlying integrated circuit structure;
   b) forming a planarizable layer of dielectric material over said one or more layers of dielectric material including said layer of low k dielectric material;
   c) forming a removable mask over said planarizable layer of dielectric material, said mask having openings formed therein to expose a portion of the upper surface of said planarizable layer of dielectric material over at least some of said raised portions of said integrated circuit structure;
   d) etching said exposed portions of said planarizable layer of dielectric material through such openings in said mask to remove a portion, but not all of:

i) said planarizable layer of dielectric material; and
ii) said one or more dielectric layers; formed over said raised portions of said underlying integrated circuit structure to reduce the overall volume of said planarizable layer of dielectric material overlying said raised portions of said integrated circuit structure;

e) removing said mask; and f) planarizing said planarizable layer of dielectric layer; whereby removal, before a planarization step, of a portion of the overall volume of said planarizable layer of dielectric material over said raised portions of said integrated circuit structure reduces the planarization time and thereby inhibits cracking of said layer of low k dielectric material layer.

4. The process of claim 3 wherein said openings in said mask are formed in registry with peaks of at least some of said raised portions of said underlying integrated circuit structure.

5. The process of claim 3 wherein said planarizing step comprises planarizing by a chemical mechanical polishing step.

6. The process of claim 3 wherein said step of etching said exposed portions of said planarizable layer of dielectric material through such openings in said mask to reduce the overall volume of said planarizable layer of dielectric material overlying said raised portions of said integrated circuit structure further comprises removing, by said etching step, at least 20% of the amount of material which would have been removed by said planarizing step without said etching step.

7. The process of claim 3 wherein said step of etching said exposed portions of said planarizable layer of dielectric material through such openings in said mask to reduce the overall volume of said planarizable layer of dielectric material overlying said raised portions of said integrated circuit structure further comprises removing, by said etching step, from at least 20% to about 50% of the amount of material which would have been removed by said planarizing step without said etching step.

8. The process of claim 3 wherein said one or more layers of dielectric material, including a layer of low k dielectric material, comprise a plurality of layers of dielectric material formed by the steps of:
    a) forming a base layer of dielectric material over an integrated circuit structure having raised portions thereon;
    b) forming a layer of low k dielectric material over said base layer; and
    c) forming a capping layer of dielectric material over said layer of low k dielectric material.

9. The process of claim 3 wherein said step of etching said exposed portions of said planarizable layer of dielectric material through such openings in said mask to reduce the overall volume of said planarizable layer of dielectric material is carried out without etching said underlying layer of low k dielectric material.

10. A planarization process for an integrated circuit structure which inhibits or prevents cracking of low k dielectric material which comprises:
    a) forming one or more layers of dielectric material, including a layer of low k dielectric material, over an underlying integrated circuit structure having raised portions thereon;
    b) forming a planarizable layer of dielectric material over said one or more dielectric layers;
    c) forming a removable mask over said planarizable layer of dielectric material, said mask having openings formed therein in registry with at least some of said raised portions of said underlying integrated circuit structure to expose portions of the upper surface of said planarizable layer of dielectric material over at least some of said raised portions of said integrated circuit structure;
    d) etching said exposed portions of said planarizable layer of dielectric material through such openings in said mask to remove at least a portion of said planarizable layer of dielectric material formed over said raised portions of said underlying integrated circuit structure, to reduce the overall volume of said one or more dielectric layers overlying said raised portions of said underlying integrated circuit structure;
    e) removing said mask; and
    f) planarizing said planarizable layer of dielectric layer; whereby removal, before a planarization step, of at least a portion of the overall volume of said planarizable layer of dielectric material over said one or more dielectric layers over said raised portions of said integrated circuit structure inhibits cracking of said layer of low k dielectric material.

11. The process of claim 10 wherein said openings in said mask are formed in registry with peaks of at least some of said raised portions of said underlying integrated circuit structure.

12. The process of claim 10 wherein said planarizing step comprises planarizing by a chemical mechanical polishing step.

13. The process of claim 10 wherein said step of etching said exposed portions of said one or more dielectric layers through such openings in said mask to reduce the overall volume of said one or more dielectric layers overlying said raised portions of said integrated circuit structure further comprises removing, by said etching step, at least 20% of the amount of material which would have been removed by said planarizing step without said etching step.

14. The process of claim 10 wherein said step of etching said exposed portions of said one or more dielectric layers through such openings in said mask to reduce the overall volume of said one or more dielectric layers overlying said raised portions of said integrated circuit structure further comprises removing, by said etching step, from at least 20% to about 50% of the amount of material which would have been removed by said planarizing step without said etching step.

15. The process of claim 10 wherein said one or more layers of dielectric material, including a layer of low k dielectric material, comprise a plurality of layers of dielectric material formed by the steps of:
    a) forming a base layer of dielectric material over an integrated circuit structure having raised portions thereon;
    b) forming a layer of low k dielectric material over said base layer; and
    c) forming a capping layer of dielectric material over said layer of low k dielectric material.

16. The process of claim 15 wherein said etching step further comprises etching only said capping layer of dielectric material and said layer of low k dielectric material over said raised portions of said underlying integrated circuit structure without etching said base layer of dielectric material.

17. A planarization process for an integrated circuit structure which inhibits or prevents cracking of low k dielectric material which comprises:
    a) forming a thin base layer of dielectric material over at least raised portions of said integrated circuit structure;

b) forming a layer of low k carbon-doped silicon oxide dielectric material over said base layer of dielectric material;

c) forming a thin capping layer of dielectric material over said layer of low k dielectric material;

d) forming a removable mask over said capping layer of dielectric material; said mask having openings formed therein in registry with peaks of at least some of said raised portions of said underlying integrated circuit structure to expose at least a portion of the upper surface of said capping layer of dielectric layers over at least some of said raised portions of said integrated circuit structure;

e) etching exposed portions of said one or more dielectric layers through such openings in the mask to remove a portion, but not all, of said capping layer of dielectric material and underlying layer of low k carbon-doped silicon oxide dielectric material formed over said raised portions of said underlying integrated circuit structure, to reduce the overall volume of said dielectric layers overlying said raised portions of said underlying integrated circuit structure;

f) removing said mask;

g) forming a planarizable layer of dielectric material over said etched capping layer of dielectric material and said layer of low k dielectric layers; and h) planarizing said planarizable layer of dielectric layer; whereby removal, before a planarization step, of a portion of the overall volume of said capping layer of dielectric material and said layer of low k dielectric material over said raised portions of said integrated circuit structure inhibits cracking of said layer of low k dielectric material.

* * * * *